United States Patent
Lee

(10) Patent No.: US 6,841,322 B1
(45) Date of Patent: Jan. 11, 2005

(54) DETECTING EROSION IN COLLECTOR OPTICS WITH PLASMA SOURCES IN EXTREME ULTRAVIOLET (EUV) LITHOGRAPHY SYSTEMS

(75) Inventor: Sang Hun Lee, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/611,069

(22) Filed: Jun. 30, 2003

(51) Int. Cl.[7] .......................... G03C 5/00; G01N 27/00; G06F 19/00

(52) U.S. Cl. ...................... 430/30; 324/71.2; 702/184

(58) Field of Search .................. 430/4, 5, 30; 324/71.1, 324/71.2; 700/121; 438/5, 10, 12–14, 17; 702/184

Primary Examiner—Evan Pert
(74) Attorney, Agent, or Firm—Blakely, Sokoloff, Taylor & Zafman LLP

(57) ABSTRACT

An embodiment of the present invention includes a technique to detect erosion in an extreme ultra violet (EUV) source collector system. An initial impedance and a coating impedance of a multi-layer (ML) coating of the collector in one of an extreme ultra violet lithography (EUVL) stepper and an optical system are obtained at first and second time instants. A relation between the coating and initial impedances is generated. An erosion rate of the ML coating is determined based on the relation.

30 Claims, 6 Drawing Sheets

DETECTING EROSION IN COLLECTOR OPTICS WITH PLASMA SOURCES IN EXTREME ULTRAVIOLET (EUV) LITHOGRAPHY SYSTEMS

BACKGROUND

1. Field of the Invention

Embodiments of the invention relates to the field of semiconductor, and more specifically, to lithography.

2. Description of Related Art

Extreme ultraviolet lithography (EUVL) is a new generation lithography that uses extreme ultraviolet (EUV) radiation with a wavelength in the range of 10 to 14 nanometer (nm) to carry out projection imaging. The EUVL system uses reflective optics and masks in which the image is formed in an absorbing metal.

The performance or throughput of the EUVL system may be degraded due to a number of factors. One such factor is the erosion in the multi-layer (ML) coating in the source collector optics. This erosion is believed to be caused by the highly energetic ions generated from the high power plasma source. If the ML coating is eroded, the EUV reflectivity is reduced leading to dose non-uniformity and throughput loss.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a technique to detect erosion in source collector optics. The collector optics are usually reflective optics using multi-layer (ML) coatings on the surfaces of the optics. An initial impedance and a coating impedance of a multi-layer (ML) coating of the collectors in one of an extreme ultra violet lithography (EUVL) stepper and an optical system are obtained at first and second time instants. For EUV wavelengths, the multi-layers are typically made of ~40 Mo/Si or Mo/Be as Bragg's reflectors resulting ~70% peak reflectivity. A relation between the coating and initial impedances is generated. An erosion rate of the ML coating is determined based on the relation. After installation of the collector optics, the measurements are taken in-situ and monitor the erosion rate.

In the following description, numerous specific details are set forth. However, it is understood that embodiments of the invention may be practiced without these specific details. In other instances, well-known circuits, structures, and techniques have not been shown in order not to obscure the understanding of this description.

Figure 1:
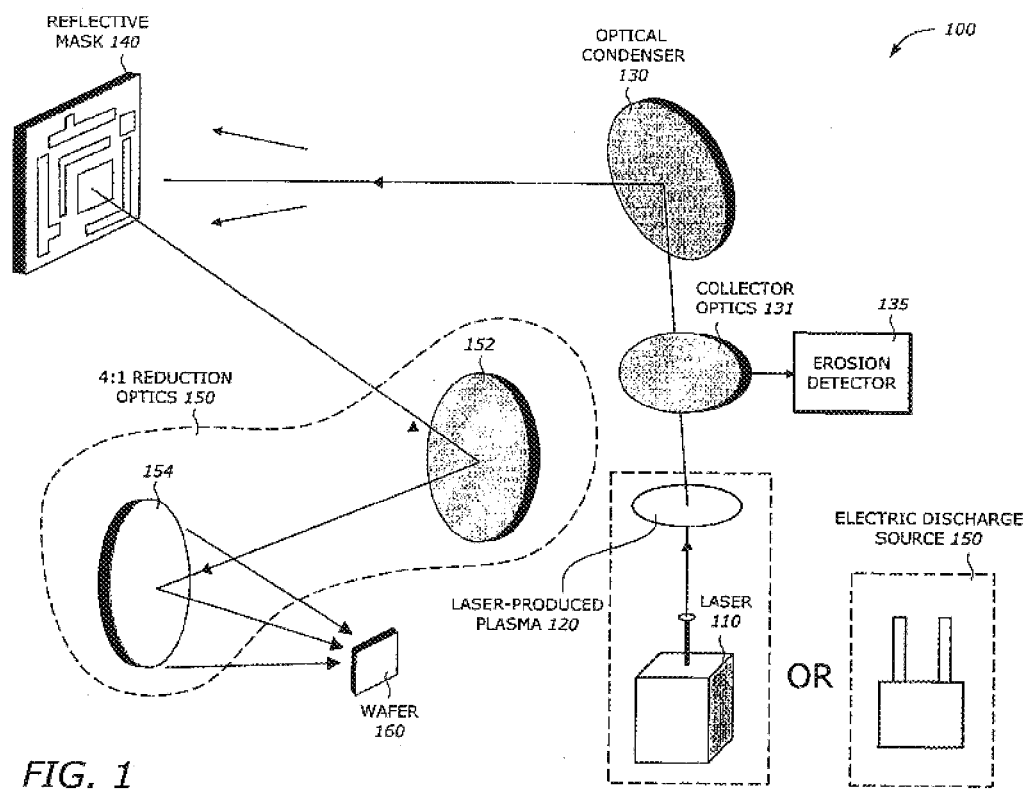
FIG. 1 is a diagram illustrating a system in which one embodiment of the invention can be practiced.

FIG. 1 is a diagram illustrating a system 100 in which one embodiment of the invention can be practiced. The system 100 includes a laser 1 10, a laser-produced plasma 120, an optical condenser 130, an optical collector 131, an erosion detector 135, a reflective mask 140, a reduction optics 150, and a wafer 160. Alternatively, the laser 100 and the laser produced plasma 120 can be replaced with an electric discharge source 150.

The laser 110 generates a laser beam to bombard a target material like liquid filament Xe or Sn. This produces the plasma 120 with a significant broadband extreme ultra-violet (EUV) radiation. The optical collector 131 collects the EUV radiation from the plasma. After the collector optics, the EUV light is delivered to the mask through a number of mirrors coated with EUV interference films or ML coating. The laser-produced plasma can be replaced with the electric discharge source 150 to generate the EUV light. The Xe or Sn is used in the electric discharge source 150. The optical condenser 130 illuminates the reflective mask 140 with EUV radiation at 13–14 nrm wavelengths. The collector optics 131 and condenser optics 130 may include a multilayer (ML) coating. The optical collectors 131 may be eroded over time for being exposed to the plasma 120. The optical collectors 131 include circuitry or interface circuits to the erosion detector 135. The erosion detector 135 detects if there is an erosion in the ML coating of the collectors 131. By monitoring the erosion in the ML coating continuously, severe erosion may be detected and replacement of eroded collectors may be performed in a timely fashion.

The reflective mask 140 has an absorber pattern across its surface. The pattern is imaged at 4:1 demagnification by the reduction optics 150. The reduction optics 150 includes a number of mirrors such as mirrors 152 and 154. These mirrors are aspherical with tight surface figures and roughness (e.g., less than 3 Angstroms). The wafer 160 is resist-coated and is imaged by the pattern on the reflective mask 140. Typically, a step-and-scan exposure is performed, i.e., the reflective mask 140 and the wafer 160 are synchronously scanned. Using this technique, a resolution less than 50nm is possible. Note that the diagrams shown in the figures are for illustrative purposes only. The dimensions are not scaled.

Figure 2:
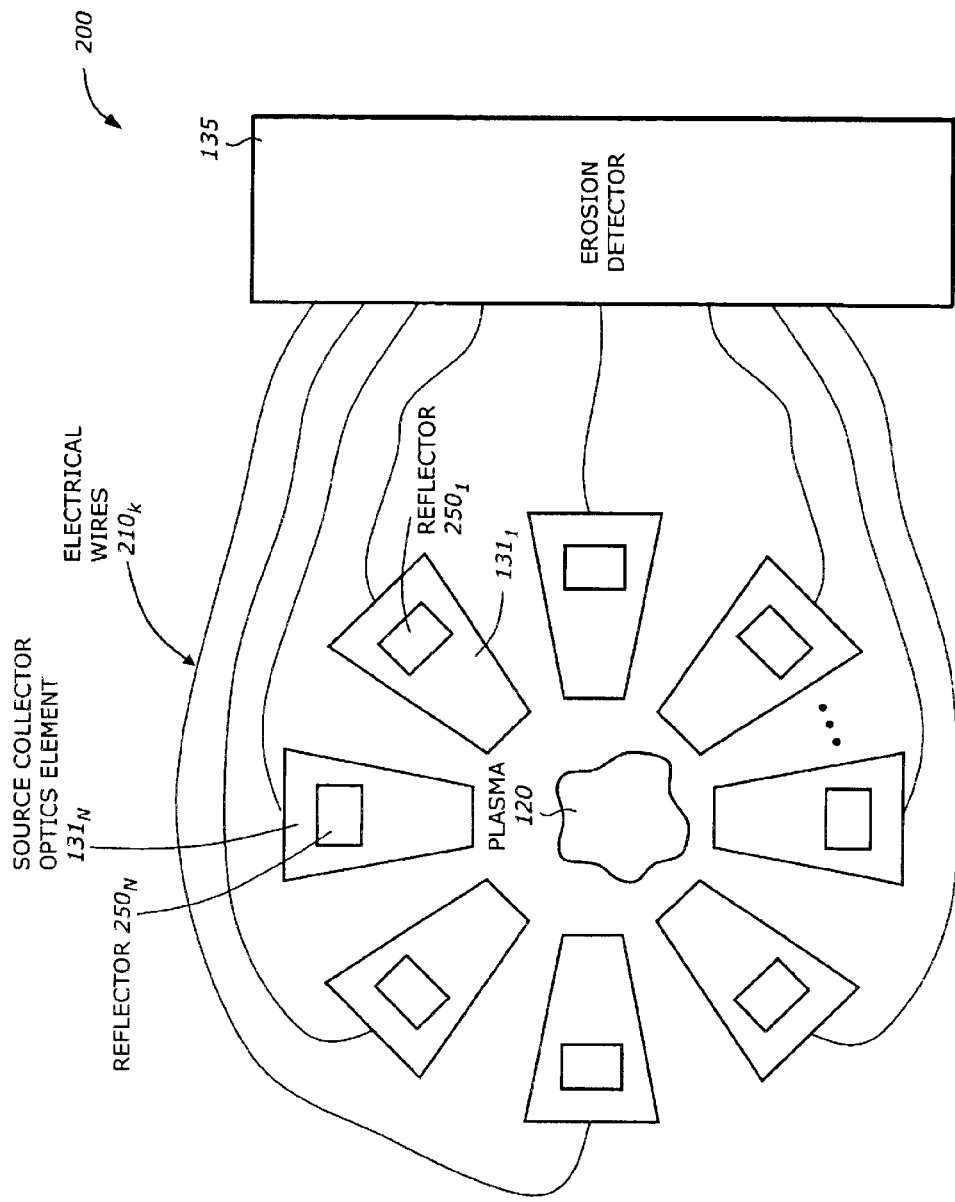
FIG. 2 is a diagram illustrating a multi-collector optical system according to one embodiment of the invention.

FIG. 2 is a diagram illustrating a multi-collector optical system 200 according to one embodiment of the invention. The system 200 includes N collectors $130_1$ to $130_N$ and the erosion detector 135.

Each of the N collectors $131_1$, to $131_N$ is as described in FIG. 2. They are part of a multi-collector optical system. They may be located around the plasma source 120 or they can be placed in grazing incident angle for the electric discharge source. Each of the N collectors $131_1$, to $131_N$ has a reflector $250_j (j=1, \ldots, N)$ which includes a multilayer (ML) coating. Note that since each collector is already made of ML coating, a separate reflector may not be needed, but it can be done as an option. The multi-layer mirrors themselves can serve as a reflector. It, or the ML mirror of the collector optic, has electrical connections to the erosion detector via electrical wires $210_j (j=1, \ldots, N)$ formed on the contacts of the ML coating as will be described in FIG. 5. The electrical wires provide an interface to the erosion detector 135.

The erosion detector 135 detects erosion in each of the collector optics in the collector system or N reflectors $250_1$, to $250_N$. It determines if a performance degradation is detected due to the erosion in the ML coating of the collector optics. The erosion detector 135 may be located near the optical system or remotely.

Figure 3:
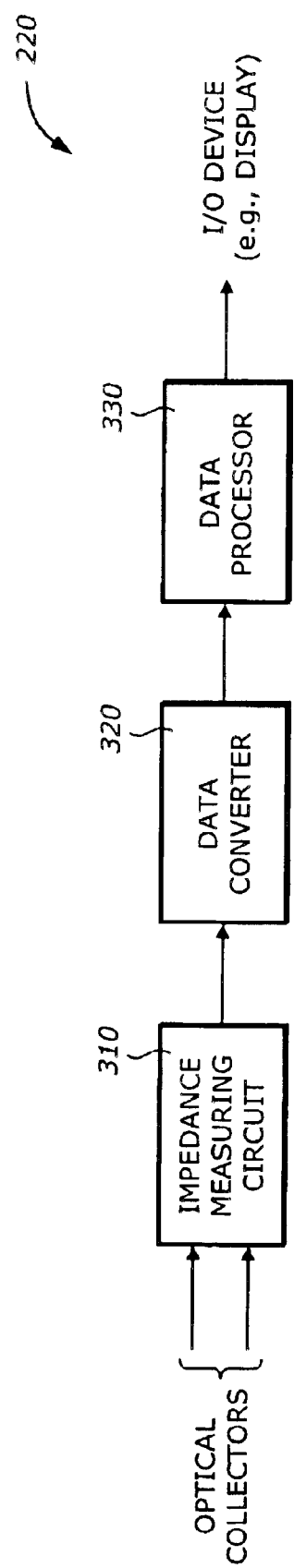
FIG. 3 is a diagram illustrating an erosion detector according to one embodiment of the invention.

FIG. 3 is a diagram illustrating the erosion detector 135 according to one embodiment of the invention. The erosion detector 135 includes an impedance measuring circuit 310, a data converter 320, and a data processor 330. The erosion detector 135 may be designed- to work with a single collector or multiple collectors.

The impedance measuring circuit 310 measures or monitors the impedance of the ML coating on the collector optics. There may be any number of this circuits connected to the multiple collectors or there may be only one circuit that is multiplexed to measure all the N collectors. The circuit 310 may measure the impedance, the resistance, the capacitance, or even inductance of the corresponding ML coating. Appropriate circuit elements may be used to operate at various frequencies for both alternating current (AC) and direct current (DC) analyses. Typically, the impedance measuring circuit 310 includes a number of elements such as amplifiers, filters, etc.

The data converter 320 converts the analog information from the impedance measuring circuit 310 into digital data for further processing. It may be a data acquisition system with appropriate number of channels for multiplexing operations. It may include a sample-and-hold device and an analog-to-digital converter (ADC) with an appropriate word length.

The data processor 330 receives the digital information representing the measured impedance at some time instant. It then processes the data to determine if erosion has become significant. The data processor 330 may be located locally or remotely. If the data processor 330 detects that a performance degradation has occurred based on the impedances, it may initiate a warning message to the user.

The data processor 330 may include a number of hardware elements to perform the operations in detecting erosion. It may include control circuits to send command to the impedance measuring circuit 310 and the data converter 320. It may also be a general purpose processor that executes program code to perform the erosion detection operations.

Figure 4:
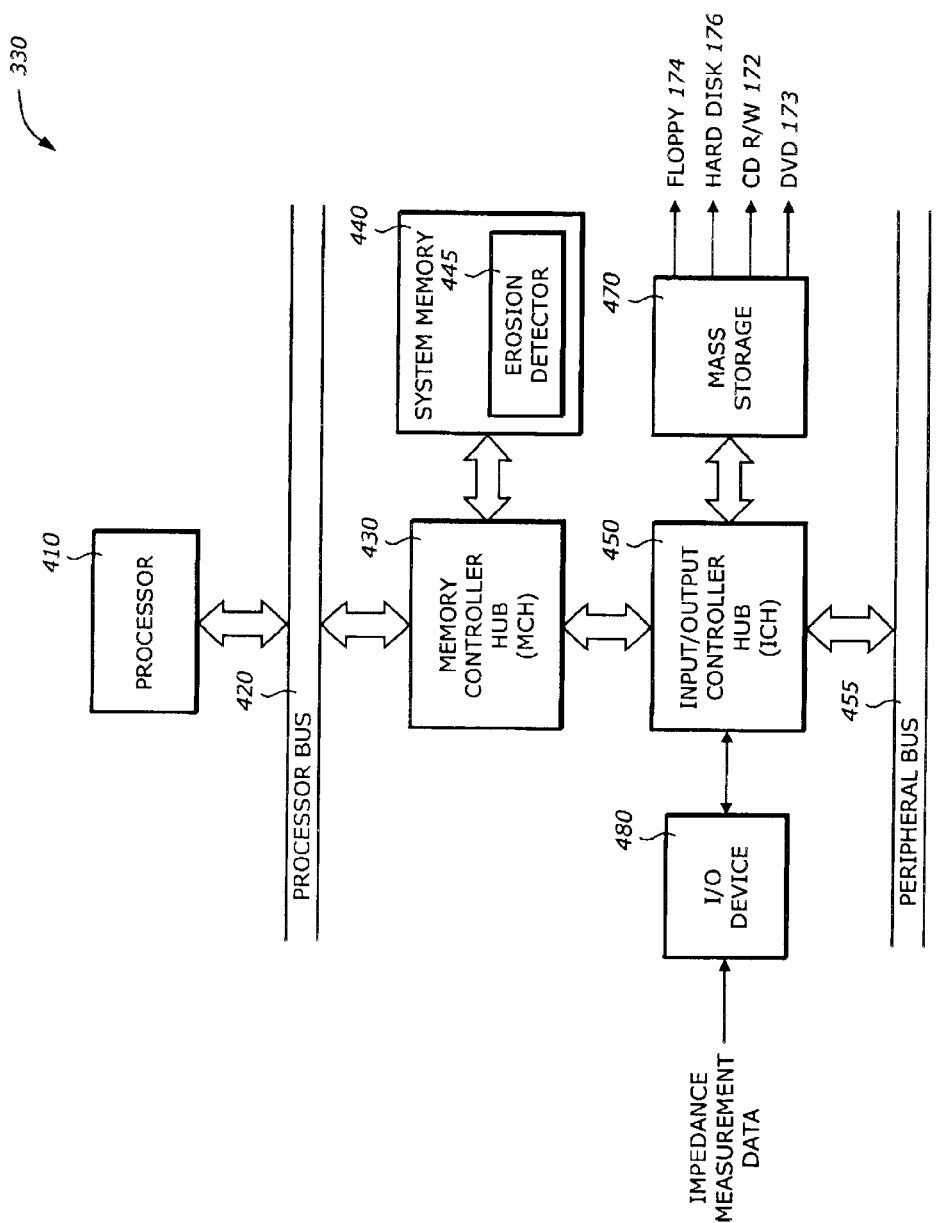
FIG. 4 is a diagram illustrating a data processor according to one embodiment of the invention.

FIG. 4 is a diagram illustrating a data processor 330 in which one embodiment of the invention can be practiced. The data processor 330 includes a processor 410, a processor bus 420, a memory control hub (MCH) 430, a system memory 440, an input/output control hub (ICH) 450, a peripheral bus 455, a mass storage device 470, and input/output devices $480_1$ to $480_k$. Note that the data processor 330 may include more or less elements than these elements.

The processor 410 represents a central processing unit of any type of architecture, such as embedded processors, mobile processors, micro-controllers, digital signal processors, superscalar computers, vector processors, single instruction multiple data (SIMI) computers, complex instruction set computers (CISC), reduced instruction set computers (RISC), very long instruction word (VLIW), or hybrid architecture.

The processor bus 420 provides interface signals to allow the processor 410 to communicate with other processors or devices, e.g., the MCH 430. The processor bus 420 may support a uni-processor or multiprocessor configuration. The processor bus 420 may be parallel, sequential, pipelined, asynchronous, synchronous, or any combination thereof.

The MCH 430 provides control and configuration of memory and input/output devices such as the system memory 440 and the ICH 450. The MCH 430 may be integrated into a chipset that integrates multiple functionalities such as the isolated execution mode, host-to-peripheral bus interface, memory control. The MCH 430 interfaces to the peripheral bus 455. For clarity, not all the peripheral buses are shown. It is contemplated that the data processor 330 may also include peripheral buses such as Peripheral Component Interconnect (PCI), accelerated graphics port (AGP), Industry Standard Architecture (ISA) bus, and Universal Serial Bus (USB), etc.

The system memory 440 stores system code and data. The system memory 440 is typically implemented with dynamic random access memory (DRAM) or static random access memory (SRAM). The system memory may include program code or code segments implementing one embodiment of the invention. The system memory 440 includes an erosion detector 445. Any one of the elements of the erosion detector 445 may be implemented by hardware, software, firmware, microcode, or any combination thereof The system memory 440 may also include other programs or data which are not shown, such as an operating system.

The ICH 450 has a number of functionalities that are designed to support I/O functions. The ICH 450 may also be integrated into a chipset together or separate from the MCH 430 to perform I/O functions. The ICH 450 may include a number of interface and I/O functions such as PCI bus interface to interface to the peripheral bus 455, processor interface, interrupt controller, direct memory access (DMA) controller, power management logic, timer, system management bus (SMBus), universal serial bus (USB) interface, mass storage interface, low pin count (LPC) interface, etc.

The mass storage device 470 stores archive information such as code, programs, files, data, applications, and operating systems. The mass storage device 470 may include compact disk (CD) ROM 472, a digital video/versafile disc (DVD) 473, floppy drive 474, and hard drive 476, and any other magnetic or optic storage devices. The mass storage device 470 provides a mechanism to read machine-accessible media The machine accessible media may contain computer readable program code to perform tasks as described in the following.

The I/O devices $480_1$, to $480_K$ may include any I/O devices to perform I/O functions. Examples of I/O devices $480_1$ to $480_K$ include controller for input devices (e.g., keyboard, mouse, trackball, pointing device), media card (e.g., audio, video, graphics), network card, and any other peripheral controllers.

Elements of one embodiment of the invention may be implemented by hardware, firmware, software or any combination thereof. The term hardware generally refers to an element having a physical structure such as electronic, electromagnetic, optical, electro-optical, mechanical, electromechanical parts, etc. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc that is implemented or embodied in a hardware structure (e.g, flash memory, read only memory, erasable read only memory). Examples of firmware may include microcode, writable control store, micro-programmed structure. When implemented in software or firmware, the elements of an embodiment of the present invention are essentially the code segments to perform the necessary tasks. The software/firmware may include the actual code to carry out the operations described in one embodiment of the invention, or code that emulates or simulates the operations.

The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable or machine accessible medium include an electronic circuit, a semiconductor memory device, a read only memory (ROM), a flash memory, an erasable ROM (EROM), a floppy diskette, a compact disk (CD) ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include data that, when accessed by a machine, cause the machine to perform the operations described in the following. The machine accessible medium may also include program code embedded therein. The program code may include machine readable code to perform the operations described in the following. The term "data" here refers to any type of information that is encoded for machine-readable purposes. Therefore, it may include program, code, data, file, etc.

All or part of an embodiment of the invention may be implemented by hardware, software, or firmware, or any combination thereof. The hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

Figure 5:
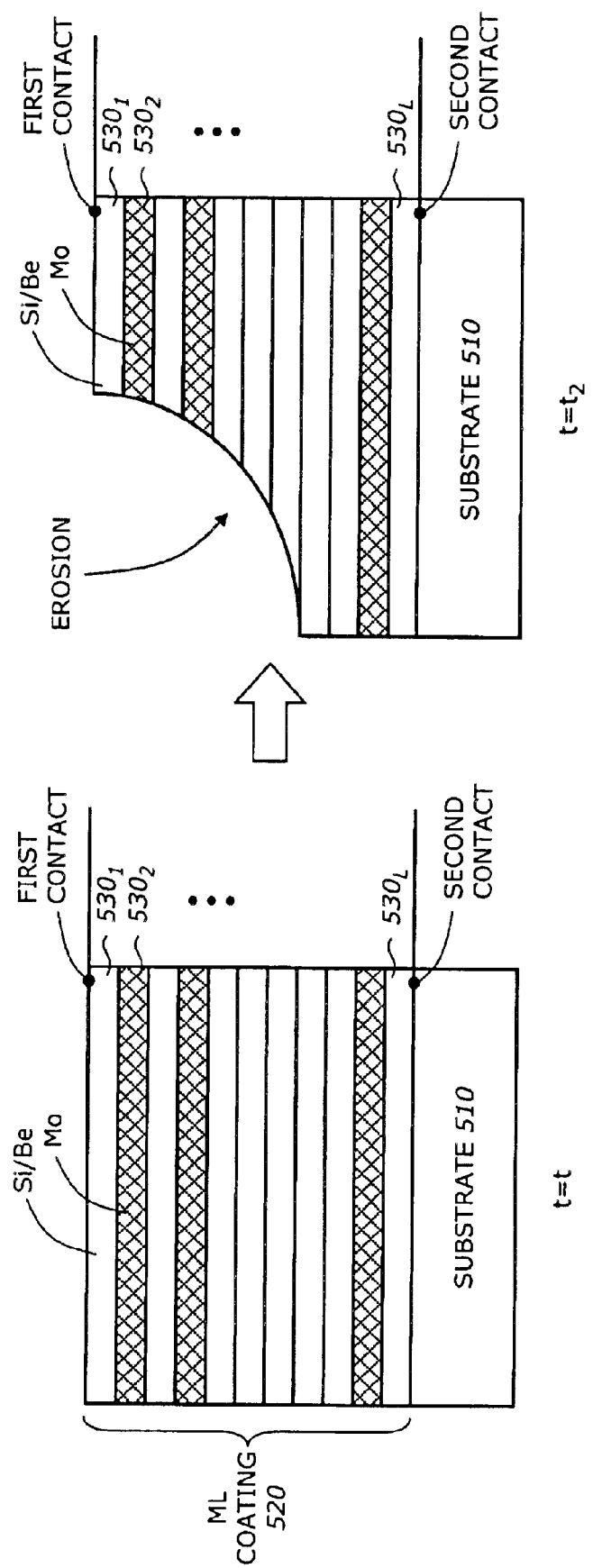
FIG. 5 is a diagram illustrating an erosion of the ML coating according to one embodiment of the invention.

FIG. 5 is a diagram illustrating an erosion of the ML coated mirror on a substrate or reflector 250 according to one embodiment of the invention. The reflector 250 includes a substrate 510 and a multilayer (ML) coating 520.

The substrate 510 is made of a material that has a low coefficient of thermal expansion (CTE), also called low thermal expansion material (LTEM), such as ultra low expansion (ULE) or Zerodur. A low CTE provides stability against temperature changes. A typical CTE is +/−30 parts per billion (ppb)/° C. over a temperature range of 5° C. to 35° C. Other properties of the substrate 210 includes stability against crystallization, thermal cycling, and mechanical cycling. In one embodiment, the substrate material is ULE glass manufactured by Corning Incorporated.

The ML coating 520 provides high reflectivity for the image projection at EUV wavelengths. It contains alternating layers $530_1$, to $530_L$ of materials having dissimilar optical constants such as silicon (Si) and molybdenum (Mo) or Mo and beryllium (Be). For EUV wavelengths, the multi-layers are typically made of ~40 Mo/Si or Mo/Be as Bragg's reflectors resulting ~70% peak reflectivity. Also, some interface material like boron carbide ($B_4C$) may be inserted between layers to improve the interface discontinuity and to improve reflectivity. A capping layer made of ruthemium (Ru) may be on top of the ML coating 520.

The electrical wires 210 have two connections to the reflector 250 at two contacts. The first and second contacts are at the top and bottom layers, respectively, of the ML coating 520 to cover the layers in between. These contacts allow measurement of impedance of the ML coating 520. The impedance may include at least one of a resistance, a capacitance, and an inductance. At a first time instant $t=t_1$, when the ML coating is fresh, an initial impedance Z, is obtained to be used as as reference for erosion detection. At a second time instant $t=t_2$ when the ML coating is eroded, a coating impedance $Z_c$ is obtained. The time instant $t_2$ may be used as initial impedance for subsequent measurements to determine the erosion rate. Because the ML coating is eroded, the impedance is changed. The impedance change between the first and the second time instants relates to the amount of erosion. This relation may be computed as a function of erosion. The relation may be non-linear due to the non-linear relationship between the impedance with respect to the geometry and shape of the layers. There are a number of forms that the relation can be expressed. For example, the ratio between $Z_c$ and $Z_i$, $Z_c/Z_i$, may indicate the amount of deviation from the initial value thus relating to the erosion.

As the erosion becomes more and more severe, the performance of the reflector 250 is further degraded due to decreased reflectivity. The performance of collector optics will be degraded. When the relation exceeds an erosion threshold, the reflectivity may not meet the required specification, and it is necessary to replace the reflector with a new one to maintain system throughput. Thus, by monitoring the impedance change, a determination of when the collector is replaced can be made. In a multiple condenser system as shown in FIG. 2, each channel of the condenser optics may be compared in-situ for the impedance measurement. The relative erosion rates for all pieces of the condenser optics can be determined. The relations of the coating impedances and the corresponding initial impedance(s) may be computed simultaneously.

Figure 6:
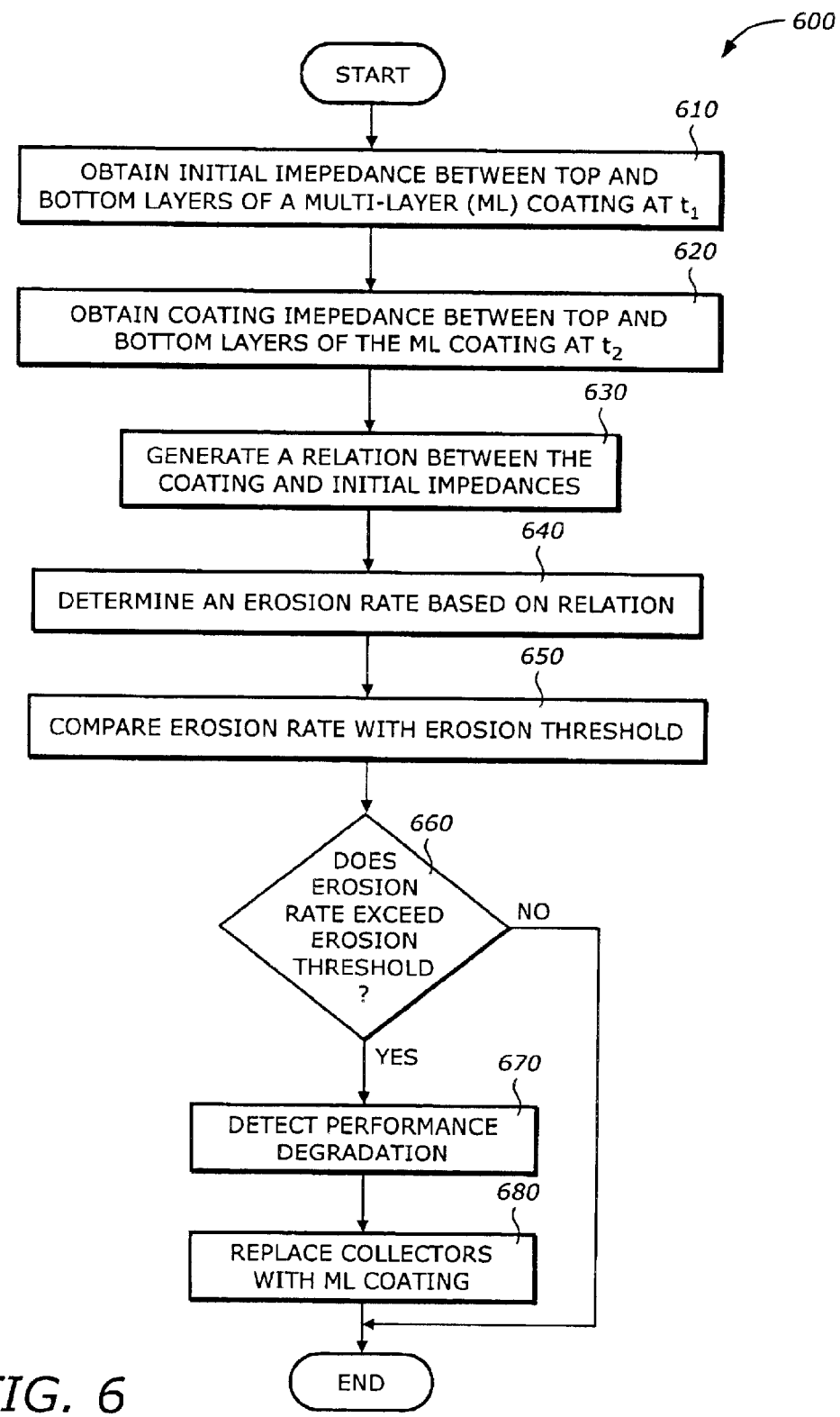
FIG. 6 is a flowchart illustrating a process to detect erosion of the ML coating according to one embodiment of the invention.

FIG. 6 is a flowchart illustrating a process 600 to detect erosion of the ML coating according to one embodiment of the invention. This process can be performed as a program execution or as hardware elements by the data processor 330 shown in FIG. 3.

Upon START, the process 600 obtains an initial impedance at time instant $t_i$ between the top and bottom layers of an ML coating in a condenser of an optical system (Block 610). This initial impedance is used as a reference. Next, the process 600 obtains a coating impedance at time instant $t_2$ of the ML coating (Block 620). Then, the process 600 generates a relation between the coating and initial impedances (Block 630). This relation corresponds to the amount of erosion in the ML coating.

Next, the process 600 determines an erosion rate based on the relation (Block 640). Using the time instants $t_1$ and $t_2$, the process 600 can derive how fast or slow the erosion is taking place. Then, the process 600 compares the erosion rate with the erosion threshold (Block 650). This erosion threshold may be determined in advance based on experimental or analytical results or both.

Next, the process 600 determines if the erosion rate exceed the erosion threshold (Block 610). If not, the process 600 is terminated Otherwise, the process 600 detects a performance degradation on the reflector (Block 670) The detection may be expressed as a warning message, a display, an announcement, etc. Next, the process 600 replaces the ML coated collector optics with a new or fresh coating or the reflector containing the ML coating (Block 680) and is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   obtaining an initial impedance and a coating impedance of a multi-layer (ML) coating of a collector in one of an extreme ultra violet light lithography (EUVL) stepper and an optical system at first and second time instants;
   generating a relation between the coating and initial impedances; and
   determining an erosion rate of the ML coating based on the relation.

2. The method of claim 1 wherein obtaining comprises:
   obtaining the initial impedance and coating impedance between first and second contacts at top and bottom layers, respectively, of the ML coating.

3. The method of claim 1 further comprising:
   comparing the erosion rate with an erosion threshold; and
   detecting a performance degradation if the erosion rate exceeds the erosion threshold.

4. The method of claim 3 further comprising:
   replacing the collector or the ML coating if the performance degradation is detected.

5. The method of claim 1 wherein obtaining comprises:
   obtaining the initial impedance and the coating impedance between the first and second contacts covering a multi-layer (ML) coating, the ML coating comprising a plurality of alternating layers of materials having dissimilar optical constants.

6. The method of claim 5 wherein obtaining comprises:
   obtaining the initial impedance and the coating impedance between the first and second contacts covering a multi-layer (ML) coating, the ML coating comprising a plurality of alternating layers of molybdenum (Mo) and silicon (Si) or Mo and beryllium (Be).

7. The method of claim 5 wherein obtaining comprises:
   obtaining the initial impedance and the coating impedance between the first and second contacts covering a multi-layer (ML) coating, the ML coating comprising a plurality of alternating layers of materials having dissimilar optical constants.

8. The method of claim 7 wherein obtaining comprises:
   obtaining the coating impedance between the first and second contacts covering a multi-layer (ML) coating, the ML coating comprising a plurality of alternating layers of materials having dissimilar optical constants and at least a layer of interface material.

9. The method of claim 1 wherein obtaining the initial impedance comprises:
   obtaining at least one of an initial capacitance and an initial resistance.

10. The method of claim 1 wherein obtaining the coating impedance comprises:
    obtaining at least one of a coating capacitance and a coating resistance.

11. An article of manufacture comprising:
    a machine-accessible medium including data that, when accessed by a machine, causes the machine to perform operations comprising:
    obtaining an initial impedance and a coating impedance of a multi-layer (ML) coating of a collector in one of an extreme ultra violet lithography (EUVL) stepper and an optical system at first and second time instants;
    generating a relation between the coating and initial impedances; and
    determining an erosion rate of the ML coating based on the relation.

12. The article of manufacture of claim 11 wherein the data causing the machine to perform obtaining comprises data that causes the machine to perform operations comprising:
    obtaining the initial impedance and coating impedance between first and second contacts at top and bottom layers, respectively, of the ML coating.

13. The article of manufacture of claim 11 wherein the data further comprises data that causes the machine to perform operations comprising:
    comparing the erosion rate with an erosion threshold; and
    detecting a performance degradation if the erosion rate exceeds the erosion threshold.

14. The article of manufacture of claim 13 wherein the data further comprises data that causes the machine to perform operations comprising:
    replacing the collector or the ML coat if the performance degradation is detected.

15. The article of manufacture of claim 11 wherein the data causing the machine to perform obtaining comprises data that causes the machine to perform operations comprising:
    obtaining the initial impedance and the coating impedance between the first and second contacts covering a multi-layer (ML) coating, the ML coating comprising a plurality of alternating layers of materials having dissimilar optical constants.

16. The article of manufacture of claim 15 wherein the data causing the machine to perform obtaining comprises data that causes the machine to perform operations comprising:
    obtaining the initial impedance and the coating impedance between the first and second contacts covering a multi-layer (ML) coating, the ML coating comprising a plurality of alternating layers of molybdenum (Mo) and silicon (Si) or Mo and beryllium (Be).

17. The article of manufacture of claim 15 wherein the data causing the machine to perform obtaining comprises data that causes the machine to perform operations comprising:

obtaining the initial impedance and the coating impedance between the first and second contacts covering a multi-layer (ML) coating, the ML coating comprising a plurality of alternating layers of materials having dissimilar optical constants.

18. The article of manufacture of claim 17 wherein the data causing the machine to perform obtaining comprises data that causes the machine to perform operations comprising:

obtaining the coating impedance between the first and second contacts covering a multi-layer (ML) coating, the ML coating comprising a plurality of alternating layers of materials having dissimilar optical constants and at least a layer of interface material.

19. The article of manufacture of claim 11 wherein the data causing the machine to perform obtaining the initial impedance comprises data that causes the machine to perform operations comprising:

obtaining at least one of an initial capacitance and an initial resistance.

20. The article of manufacture of claim 11 wherein the data causing the machine to perform obtaining the coating impedance comprises data that causes the machine to perform operations comprising:

obtaining at least one of a coating capacitance and a coating resistance.

21. A system comprising:

at least a reflector or a collector having a multilayer (ML) coating; and an erosion detector coupled to the at least reflector or collector to detect erosion in the ML coating, the erosion detector comprising:

an impedance measuring circuit to measure initial and coating impedances of the ML coating at first and second time instants, a data converter coupled to the impedance measuring circuit to convert the initial and coating impedances into corresponding digital impedance information, and a data processor coupled to the data converter to generate a relation between the coating and initial impedances and determines an erosion rate of the ML coating based on the relation.

22. The system of claim 21 wherein the impedance measuring circuit measures the initial and coating impedances between first and second contacts at top and bottom layers, respectively, of the ML coating.

23. The system of claim 21 wherein the data processor:

compares the erosion rate with an erosion threshold; and detects a performance degradation if the erosion rate exceeds the erosion threshold.

24. The system of claim 23 wherein the collector or the ML coat is replaced if the performance degradation is detected.

25. The system of claim 21 wherein the ML coating comprises a plurality of alternating layers of materials having dissimilar optical constants.

26. The system of claim 25 wherein the ML coating comprises a plurality of alternating layers of molybdenum (Mo) and silicon (Si) or Mo and beryllium (Be).

27. The system of claim 25 wherein the ML coating comprises a plurality of alternating layers of materials having dissimilar optical constants.

28. The system of claim 27 wherein the ML coating further comprises at least a layer of interface.

29. The system of claim 21 wherein the initial impedance comprises at least one of an initial capacitance and an initial resistance.

30. The system of claim 21 wherein the coating impedance comprises at least one of a coating capacitance and a coating resistance.

\* \* \* \* \*

UNITED STATES PATENT AND TRADEMARK OFFICE
CERTIFICATE OF CORRECTION

PATENT NO. : 6,841,322 B1
DATED : January 11, 2005
INVENTOR(S) : Lee

It is certified that error appears in the above-identified patent and that said Letters Patent is hereby corrected as shown below:

Column 3,
Line 53, delete "(SIMI)" and insert -- (SIMD) --.

Column 6,
Line 65, delete "$t_i$" and insert -- $t_1$ --.

Signed and Sealed this

Twenty-sixth Day of April, 2005

JON W. DUDAS
*Director of the United States Patent and Trademark Office*